(12) United States Patent
Sakiyama et al.

(10) Patent No.: US 7,705,645 B2
(45) Date of Patent: Apr. 27, 2010

(54) DELAY LOCKED LOOP CIRCUIT

(75) Inventors: Shiro Sakiyama, Kyoto (JP); Yusuke Tokunaga, Hyogo (JP); Shiro Dosho, Osaka (JP); Toru Iwata, Osaka (JP); Takashi Hirata, Osaka (JP); Hideki Yoshii, Kyoto (JP); Yasuyuki Doi, Kyoto (JP); Makoto Hattori, Kyoto (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 12/033,707

(22) Filed: Feb. 19, 2008

(65) Prior Publication Data

US 2008/0303567 A1 Dec. 11, 2008

Related U.S. Application Data

(62) Division of application No. 11/289,753, filed on Nov. 30, 2005, now abandoned.

(30) Foreign Application Priority Data

Feb. 9, 2005 (JP) ............................. 2005-033625
Sep. 12, 2005 (JP) ............................. 2005-264131

(51) Int. Cl.
*H03L 7/06* (2006.01)
(52) U.S. Cl. ...................................... 327/158
(58) Field of Classification Search ......... 327/147–150, 327/156–159
See application file for complete search history.

(56) References Cited

U.S. PATENT DOCUMENTS 5,675,620 A * 10/1997 Chen ........................... 375/376

5,754,838 A 5/1998 Shibata et al.

(Continued)

FOREIGN PATENT DOCUMENTS

JP 52-057760 5/1977

(Continued)

OTHER PUBLICATIONS

Y. Moon, et al., "An All-Analog Multiphase Delay-Locked Loop Using a Replica Delay Line for Wide-Range Operation and Low-Jitter Performance", IEEE Journal of Solid-State Circuits, vol. 35, No. 3, Mar. 2000, pp. 377-384.

(Continued)

*Primary Examiner*—Lincoln Donovan
*Assistant Examiner*—William Hernandez
(74) *Attorney, Agent, or Firm*—McDermott Will & Emery LLP

(57) ABSTRACT

A delay element generates a delayed clock signal which transitions with a delay from a rising (or falling) of a reference clock signal by a delay amount determined based on an output of a loop filter. A signal generation circuit generates two signals which complementarily change according to rising and falling of the reference clock signal and a transition of the delayed clock signal. A charge pump circuit performs on the loop filter, according to these two signals, a push (or pull) operation during an interval extending from a rising (or falling) of the reference clock signal to the transition of the delayed clock signal and a pull (or push) operation during an interval extending from the transition of the delayed clock signal to a falling (or rising) of the reference clock signal.

8 Claims, 14 Drawing Sheets

U.S. PATENT DOCUMENTS

| | | | | |
|---|---|---|---|---|
| 5,969,552 | A | * | 10/1999 | Lee et al. .................. 327/158 |
| 6,066,968 | A | * | 5/2000 | Yang ........................ 327/156 |
| 6,100,735 | A | * | 8/2000 | Lu ............................ 327/158 |
| 6,204,705 | B1 | * | 3/2001 | Lin ............................ 327/161 |
| 6,389,091 | B1 | | 5/2002 | Yamaguchi et al. |
| 6,452,432 | B2 | * | 9/2002 | Kim .......................... 327/158 |
| 6,677,791 | B2 | * | 1/2004 | Okuda et al. ............. 327/158 |
| 7,091,763 | B1 | * | 8/2006 | Johnson et al. ........... 327/175 |
| 7,103,791 | B2 | * | 9/2006 | Lin ............................ 713/401 |
| 7,161,398 | B2 | * | 1/2007 | Park et al. ................. 327/149 |
| 7,199,625 | B1 | * | 4/2007 | Chung ....................... 327/149 |
| 7,405,604 | B2 | * | 7/2008 | Lin et al. ................... 327/161 |
| 7,499,513 | B1 | * | 3/2009 | Tetzlaff et al. ............. 375/358 |
| 7,528,638 | B2 | * | 5/2009 | Lee et al. ................... 327/158 |
| 2002/0060591 | A1 | | 5/2002 | Ito |
| 2004/0179640 | A1 | * | 9/2004 | Jacob et al. ............... 375/376 |

FOREIGN PATENT DOCUMENTS

| | | |
|---|---|---|
| JP | 56-019769 | 5/1981 |
| JP | 60-036908 | 11/1985 |
| JP | 63-072937 | 5/1988 |
| JP | 08-180678 | 7/1996 |
| JP | 11-008552 | 1/1999 |
| JP | 11-205131 | 7/1999 |
| JP | 2000-082954 | 3/2000 |

OTHER PUBLICATIONS

Y. Tokunaga, et al., "ISSCC 2006/Session 18/Clock and Data Recovery/18.3", 2006 IEEE International Solid-State Circuits Conference, Feb. 7, 2006.

Japanese Office Action, with English translation, issued in Japanese Patent Application No. 2005-264131, mailed Oct. 13, 2009.

* cited by examiner

DELAY LOCKED LOOP CIRCUIT

CROSS-REFERENCE TO RELATED APPLICATIONS

This application is a divisional of application Ser. No. 11/289,753 filed on Nov. 30, 2005 now abandoned, which claims priority under 35 U.S.C. §119(a) on Japanese Patent Application No. 2005-33625 filed on Feb. 9, 2005 and Japanese Patent Application No. 2005-264131 filed on Sep. 12, 2005, the entire contents of which are hereby incorporated by reference.

BACKGROUND OF THE INVENTION

The present invention relates to a delay locked loop circuit. The delay locked loop circuit (DLL) is used for detecting an optimum strobe point of a clock signal for a data signal during a memory access, or the like. For example, in the case of single data rate (SDR), the delay locked loop circuit detects a ½ phase of a reference clock signal, whereas in the case of double data rate (DDR), the delay locked loop circuit detects a ¼ phase or ¾ phase of the reference clock signal. In general, in a memory, or the like, the delay locked loop circuit is used for timing sequence control of a word line, a sense amplifier, or the like.

FIG. 16 shows a structure of a conventional delay locked loop circuit. A delay circuit 100 includes four delay elements 101 which are connected in series. The delay circuit 100 delays reference clock signal CLKr by one cycle to output delayed clock signal CLKd. A phase comparator 102 compares the phases of reference clock signal CLKr and delayed clock signal CLKd to output signal UP and signal DN according to the comparison result. A charge pump circuit 103 (including a loop filter) controls the delay circuit 100 based on signal UP and signal DN. The delay locked loop circuit having such a structure becomes stable when the phase of delayed clock signal CLKd is delayed from the phase of reference clock signal CLKr by one cycle, and at this point in time, the delay of delayed clock signal CLKd is locked.

In the delay locked loop circuit having the above structure, the delay element 101 at the first stage of the delay circuit 100 outputs a clock signal delayed by a ¼ phase (90°). The delay element 101 at the third stage of the delay circuit 100 outputs a clock signal delayed by a ¾ phase (270°).

In the conventional delay locked loop circuit, the driving capacity and load capacity are different between reference clock signal CLKr and the delay element 101. Therefore, it is difficult to improve the accuracy for ¼ phase and ¾ phase.

In the conventional delay locked loop circuit, the delayed clock signal is generated to have a delay of ¼ phase or ¾ phase from the reference clock signal irrespective of the duty ratio of the reference clock signal. Thus, for example, if the duty ratio of the reference clock signal is lower than 25%, the ¼ phase-delayed clock signal does not rise or fall during an on-duty period of the reference clock signal, and therefore, the conventional delay locked loop circuit cannot be used with DDR. That is, there is a possibility that the conventional delay locked loop circuit does not normally operate with a reference clock signal whose duty ratio is not 50%.

In the conventional delay locked loop circuit, based on its principle, signals UP and DN having extremely short pulses are output even after the delay of delayed clock signal CLKd is locked. Therefore, the conventional delay locked loop circuit has static jitters. Although the static jitters can be suppressed by decreasing a delay gain, the decrease of the delay gain deteriorates the response speed achieved till the delay is locked, i.e., delays the locking time. Alternatively, the static jitters can be suppressed by increasing the capacitance of a loop filter to have a larger filter time constant. However, in this case, the circuit scale increases.

SUMMARY OF THE INVENTION

In view of the above problems, an objective of the present invention is to realize a delay locked loop circuit which does not have static jitters based on its principle and is capable of generating a delayed clock signal with high accuracy irrespective of the duty ratio of a reference clock signal.

A measure taken by the present invention for achieving the above objective is a delay locked loop circuit, comprising: a delay element for generating a delayed clock signal which transitions from a first logic level to a second logic level with a delay from a first transition of a reference clock signal from a first logic level to a second logic level; a signal generation circuit for generating first and second signals which complementarily change according to the first transition of the reference clock signal, a second transition of the reference clock signal from the second logic level to the first logic level, and a transition of the delayed clock signal; a charge pump circuit for performing, according to the first and second signals, a first operation during an interval extending from the first transition of the reference clock signal to the transition of the delayed clock signal and a second operation during an interval extending from the transition of the delayed clock signal to the second transition of the reference clock signal, the first operation being any one of a push operation and a pull operation, and the second operation being the other of the push operation and the pull operation; and a loop filter which receives an output of the charge pump circuit. The delay element controls a delay amount between the first transition of the reference clock signal and the transition of the delayed clock signal based on an output of the loop filter.

BEST MODES FOR CARRYING OUT THE INVENTION

Hereinafter, the best modes for carrying out the invention will be described with reference to the drawings.

Embodiment 1

Figure 1:
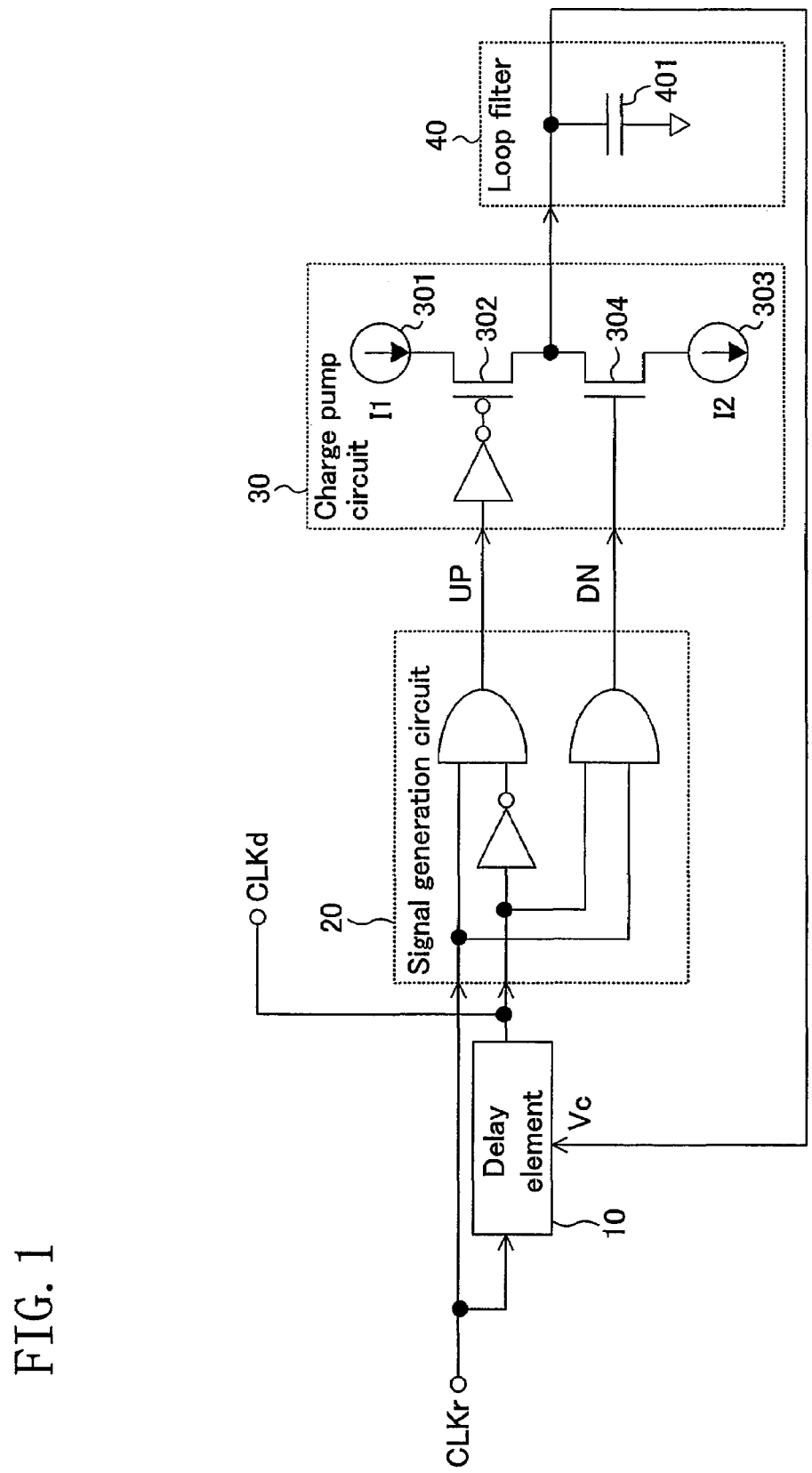
FIG. 1 shows a structure of a delay locked loop circuit according to embodiment 1.

FIG. 1 shows a structure of a delay locked loop circuit according to embodiment 1 of the present invention. The delay locked loop circuit of embodiment 1 includes a delay element 10, a signal generation circuit 20, a charge pump circuit 30, and a loop filter 40. The delay element 10 receives reference clock signal CLKr and outputs delayed clock signal CLKd. The delay amount of delayed clock signal CLKd is controlled according to control voltage Vc output from the loop filter 40. The signal generation circuit 20 outputs a logical product of reference clock signal CLKr and the inverse of delayed clock signal CLKd as signal UP and a logical product of reference clock signal CLKr and delayed clock signal CLKd as signal DN. The charge pump circuit 30 includes a current source 301, a switch 302 for controlling conduction/interruption of current I1 supplied by the current source 301 according to signal UP, a current source 303, and a switch 304 for controlling conduction/interruption of current I2 supplied by the current source 303 according to signal DN. When signal UP is at Hi (high) level, the charge pump circuit 30 outputs current I1 to the outside (push operation). When signal DN is at Hi level, the charge pump circuit 30 introduces current I2 from the outside (pull operation). The loop filter 40 includes a capacitance 401. The loop filter 40 integrates the output of the charge pump circuit 30 to generate control voltage Vc.

Figure 2:
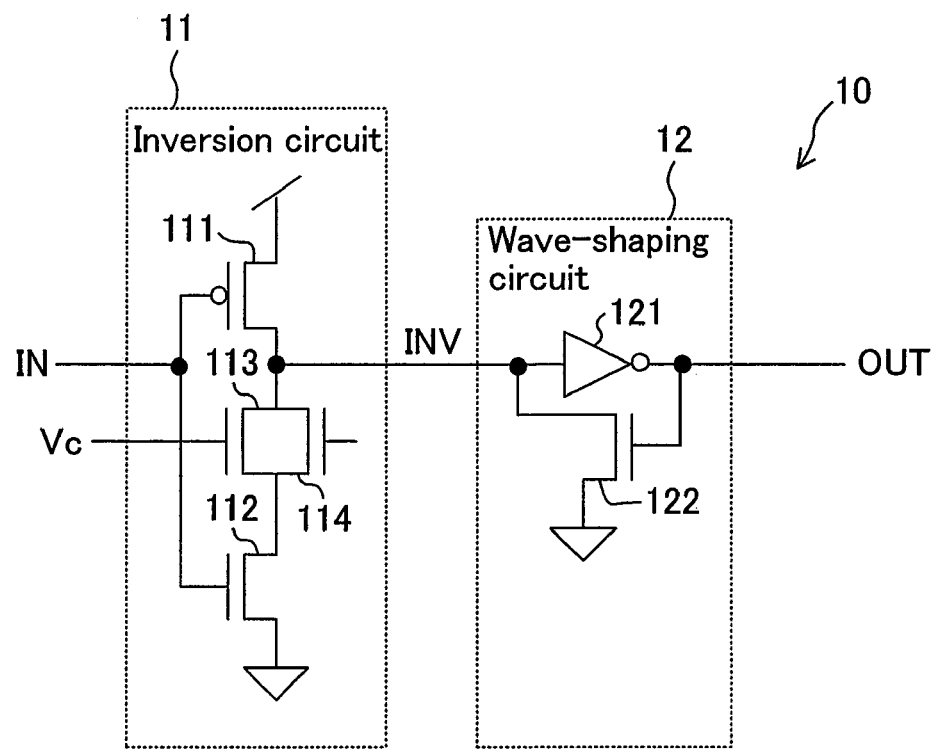
FIG. 2 shows a structure of a delay element.

FIG. 2 shows a structure of the delay element 10. In the delay element 10, an inversion circuit 11 logically inverts signal IN input to the delay element 10 to output signal INV. Specifically, the inversion circuit 11 includes a PMOS transistor 111 and an NMOS transistor 112 which are connected in series, an NMOS transistor 113 which is connected between the transistors 111 and 112, and an NMOS transistor 114 which is connected in parallel with the NMOS transistor 113. The gates of transistors 111 and 112 are each supplied with signal IN. Signal INV is output from the connection point of the transistors 111 and 113. The gate of the NMOS transistor 113 is supplied with control voltage Vc which is output from the loop filter 40. The gate of the NMOS transistor 114 is supplied with a predetermined voltage. Meanwhile, a wave-shaping circuit 12 shapes the waveform of signal INV to generate signal OUT which is output from the delay element 10. Specifically, the wave-shaping circuit 12 includes an inverter 121 and an NMOS transistor 122. The inverter 121 receives signal INV and outputs signal OUT. The drain and gate of the NMOS transistor 122 are connected to the input terminal and output terminal of the inverter 121, respectively. The source of the NMOS transistor 122 is supplied with a predetermined voltage, e.g., the ground voltage.

In the inversion circuit 11, when signal IN is at Lo (low) level, the transistor 111 which functions as a switch is turned on while the transistor 112 which also functions as a switch is turned off. As a result, the subsequent stage of the inversion circuit 11 is supplied with electric charges from the power supply node so that signal INV rises to Hi level. When signal IN is at Hi level, the transistor 111 is turned off while the transistor 112 is turned on. As a result, the electric charges supplied to the subsequent stage are extracted out to the ground node so that signal INV falls to Lo level.

Figure 3:
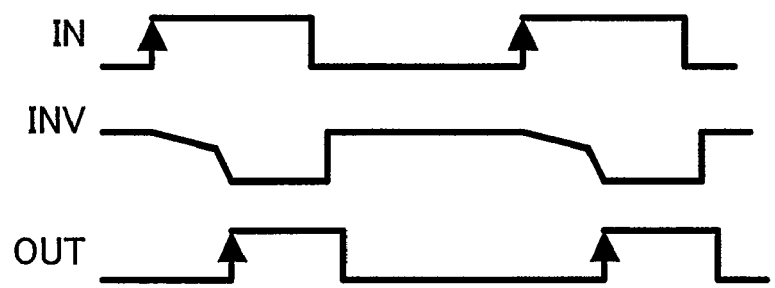
FIG. 3 is a timing chart of the delay element.

FIG. 3 is a timing chart of the delay element 10. When signal IN falls, signal INV immediately transitions from Lo level to Hi level. On the other hand, even when signal IN rises, signal INV does not immediately transitions from Hi level to Lo level but transitions relatively moderately. This is because extraction of the electric charges by the transistors 113 and 114 to the ground node is restricted. Signal INV having such a blunt waveform is shaped by the wave-shaping circuit 12 and output as signal OUT which has sharp rising and falling edges. The wave-shaping circuit 12 also produces the effect of suppressing ringing which would occur in signal INV.

As described above, as a result of the restriction on extraction of electric charges to the ground node by the transistors 113 and 114, a rising of signal OUT occurs with some delay after the rising of signal IN. By appropriately adjusting control voltage Vc, the state of a channel formed in the transistor 113 changes so that the transition speed of signal INV from Hi level to Lo level changes. As a result, the delay amount of signal OUT is adjusted. It should be noted that the transistor 114 functions as a current supply which introduces an electric current of a certain magnitude. That is, the minimum restriction is placed on extraction of electric current to the ground node. If without this restriction, control voltage Vc would change only a little when an electric current flowing through the transistor 113 is relatively small, and accordingly, the delay amount of delayed clock signal CLKd is greatly varied, resulting in an oscillation.

Figure 4:
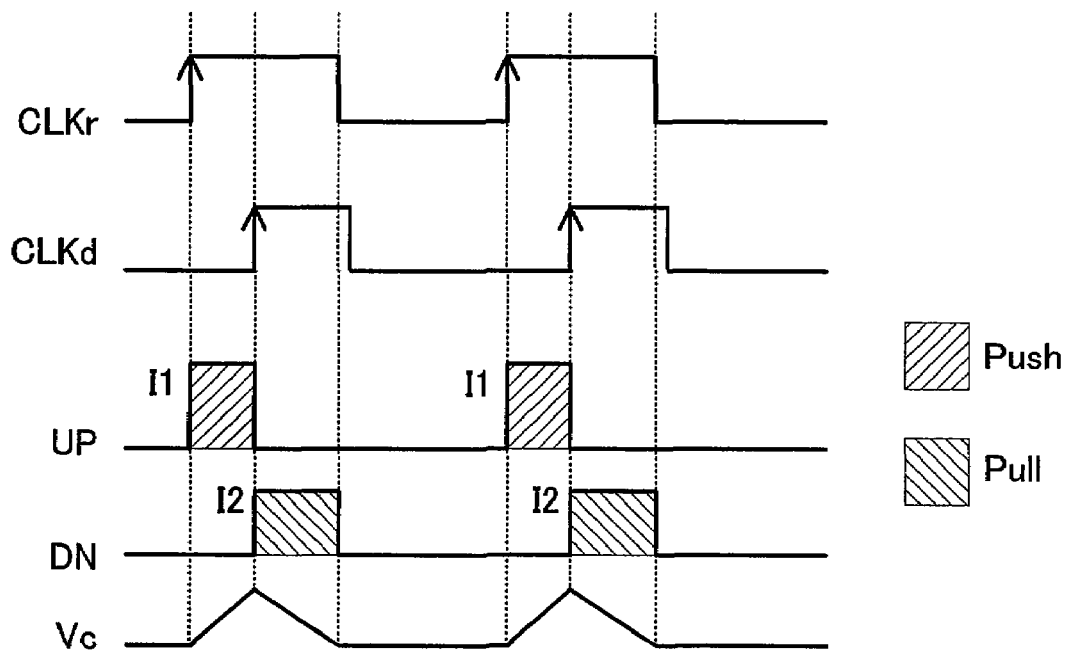
FIG. 4 is a timing chart of the delay locked loop circuit according to embodiment 1.

FIG. 4 is a timing chart of the delay locked loop circuit according to embodiment 1. Reference clock signal CLKr and delayed clock signal CLKd respectively correspond to signal IN and signal OUT shown in FIG. 3. Signal UP is at Hi level during a period extending from a rising of reference clock signal CLKr to a rising of delayed clock signal CLKd. Signal DN is at Hi level during a period extending from a rising of delayed clock signal CLKd to a falling of reference clock signal CLKr. That is, within an on-duty period of reference clock signal CLKr, signal UP is at Hi level before the rising of delayed clock signal CLKd, and signal DN is at Hi level after the rising of delayed clock signal CLKd. In the timing chart shown in FIG. 4, the magnitude of an electric current flowing from the charge pump circuit 30 to the outside (push current) and the magnitude of an electric current flowing from the outside to the charge pump circuit 30 (pull current) are shown on the line segments of signal UP and signal DN by hatch lines.

When reference clock signal CLKr rises, signal UP transitions to Hi level. Accordingly, current I1 is supplied from the charge pump circuit 30 to the loop filter 40, and control voltage Vc gradually increases. When control voltage Vc is relatively low, the delay amount of delayed clock signal CLKd is relatively large. On the contrary, when control voltage Vc is relatively high, the delay amount of delayed clock signal CLKd is relatively small. Therefore, the increase of control voltage Vc results in the decrease of the delay amount of delayed clock signal CLKd. When a certain time period is passed after the rising of reference clock signal CLKr, delayed clock signal CLKd rises. As a result, signal DN rises to Hi level, so that current I2 is introduced from the loop filter 40 to the charge pump circuit 30. Accordingly, control voltage Vc gradually decreases to the original level.

In the delay locked loop circuit of embodiment 1, the rising of delayed clock signal CLKd occurs at a time point determined by internally dividing the on-duty period of reference clock signal CLKr in a certain ratio. This ratio is determined according to the relationship between currents I1 and I2. That is, in the delay locked loop circuit of embodiment 1, a feedback system works to attain equilibrium between the amount of charges transferred by the push operation of the charge pump circuit 30 and the amount of charges transferred by the pull operation of the charge pump circuit 30 and becomes stable at the time where the ratio between Hi periods of signal UP and signal DN is equal to the ratio between the reciprocal of current I1 and the reciprocal of current I2. Thus, by appropriately setting the magnitude of currents I1 and I2, delayed clock signal CLKd can be adjusted so as to rise at a time point which internally divides the on-duty period of reference clock signal CLKr in a desired ratio.

Especially when currents I1 and I2 are equal, the rising of delayed clock signal CLKd occurs just at the midpoint of the on-duty period of reference clock signal CLKr. That is, it is possible to obtain delayed clock signal CLKd which rises at the midpoint of the on-duty period of reference clock signal CLKr irrespective of whether or not the duty ratio of reference clock signal CLKr is 50%.

In a conventional delay locked loop circuit, although none of signals UP and DN is ideally output in a stationary state, very short pulses are output based on its principle in the actuality and cause static jitters. In the delay locked loop circuit of embodiment 1, in a stationary state, signals UP and DN are always output such that equilibrium is attained between the amount of charges transferred by the push operation of the charge pump circuit 30 and the amount of charges transferred by the pull operation of the charge pump circuit 30. Thus, control voltage Vc repeats gradual increase and decrease as shown in FIG. 4, but the delay amount of the delay element 10 is determined by the voltage trajectory of the increasing part of the graph. Therefore, in the delay locked loop circuit of embodiment 1, the causes of static jitters are not generated based on its principle. As a result, an output, i.e., a delayed clock signal, has excellent jitter characteristics.

As described above, according to embodiment 1, a delayed clock signal which has no static jitters based on its principle and is highly accurate irrespective of the duty ratio of a reference clock signal can be generated.

It should be noted that the delay locked loop circuit of embodiment 1 may be constructed to operate based on the logic opposite to that described above.

Embodiment 2

Figure 5:
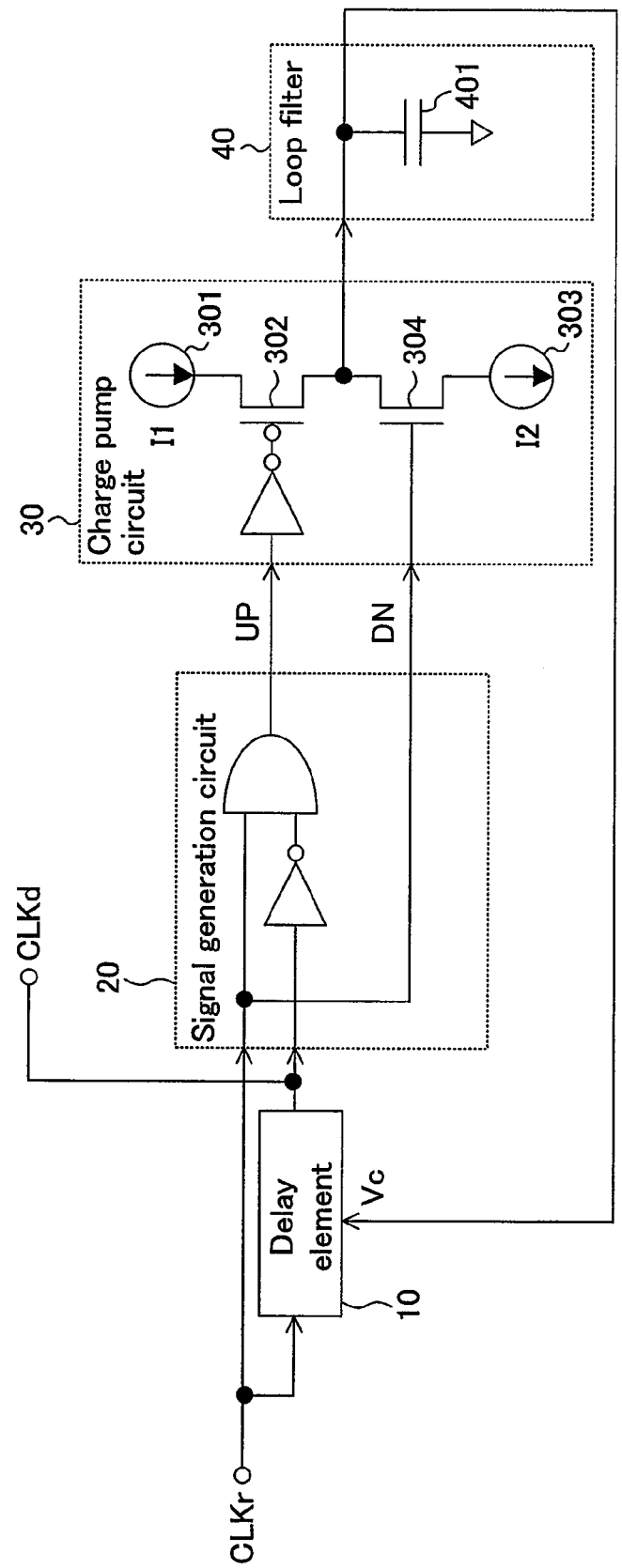
FIG. 5 shows a structure of a delay locked loop circuit according to embodiment 2.

FIG. 5 shows a structure of a delay locked loop circuit according to embodiment 2 of the present invention. The delay locked loop circuit of embodiment 2 includes a signal generation circuit 20 whose structure is different from that of the signal generation circuit 20 of embodiment 1. The signal generation circuit 20 of embodiment 2 outputs a logical product of reference clock signal CLKr and the inverse of delayed clock signal CLKd as signal UP and reference clock signal CLKr as signal DN. Hereinafter, the delay locked loop circuit of embodiment 2 is described only as to the differences from the delay locked loop circuit of embodiment 1.

Figure 6:
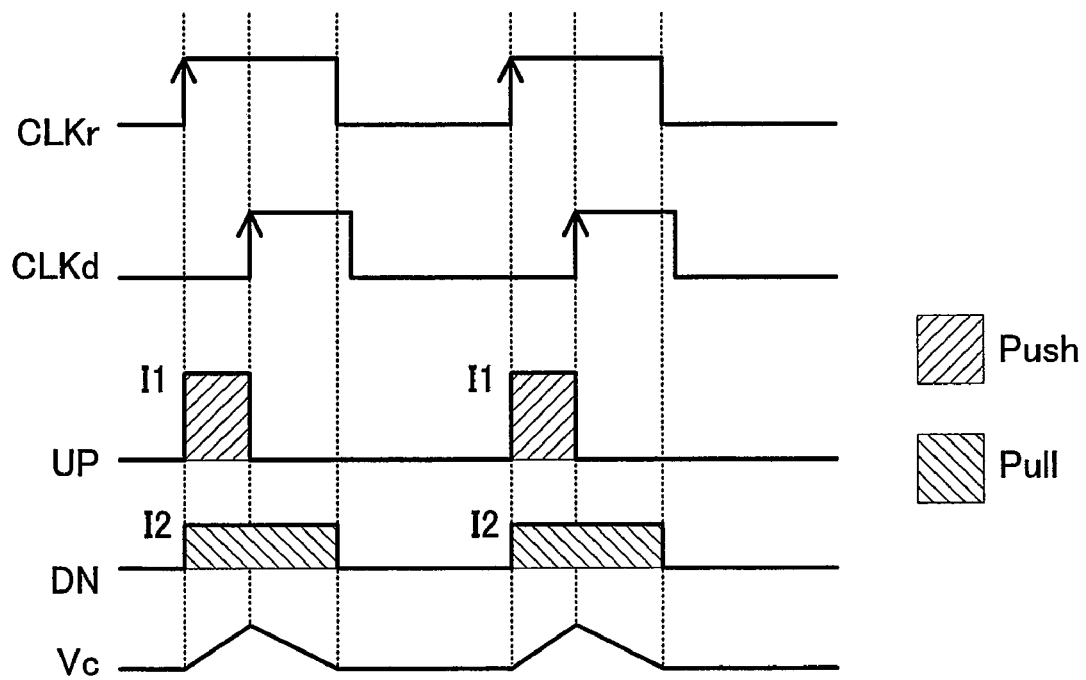
FIG. 6 is a timing chart of the delay locked loop circuit according to embodiment 2.

FIG. 6 is a timing chart of the delay locked loop circuit according to embodiment 2. Signal UP is at Hi level during a period extending from a rising of reference clock signal CLKr to a rising of delayed clock signal CLKd. Signal DN is the same as reference clock signal CLKr. In the timing chart shown in FIG. 6, the magnitude of an electric current flowing from the charge pump circuit 30 to the outside (push current) and the magnitude of an electric current flowing from the outside to the charge pump circuit 30 (pull current) are shown on the line segments of signal UP and signal DN by hatch lines.

When reference clock signal CLKr rises, signal UP and signal DN transition to Hi level, so that the switches 302 and 304 of the charge pump circuit 30 are closed. Accordingly, the difference between current I1 and current I2 is supplied from the charge pump circuit 30 to the loop filter 40, and control voltage Vc gradually increases. When a certain time period is passed after the rising of reference clock signal CLKr, delayed clock signal CLKd rises. As a result, only signal UP falls to Lo level so that only the switch 302 is opened. Current I2 is introduced from the loop filter 40 to the charge pump circuit 30, and accordingly, control voltage Vc gradually decreases to the original level. Thus, by appropriately setting the magnitude of currents I1 and I2, delayed clock signal CLKd can be adjusted so as to rise at a time point which internally divides the on-duty period of reference clock signal CLKr in a desired ratio.

Especially when the magnitude of current I1 is twice that of current I2, the magnitude of a current which is supplied when both the switches 302 and 304 of the charge pump circuit 30 are closed is equal to the magnitude of a current which is introduced when only the switch 304 is closed. As a result, the rising of delayed clock signal CLKd occurs just at the midpoint of the on-duty period of reference clock signal CLKr.

As described above, according to embodiment 2, the structure of the signal generation circuit 20 is simpler than that of the signal generation circuit 20 of embodiment 1. Thus, the circuit scale of the entire delay locked loop circuit is decreased.

Embodiment 3

Figure 7:
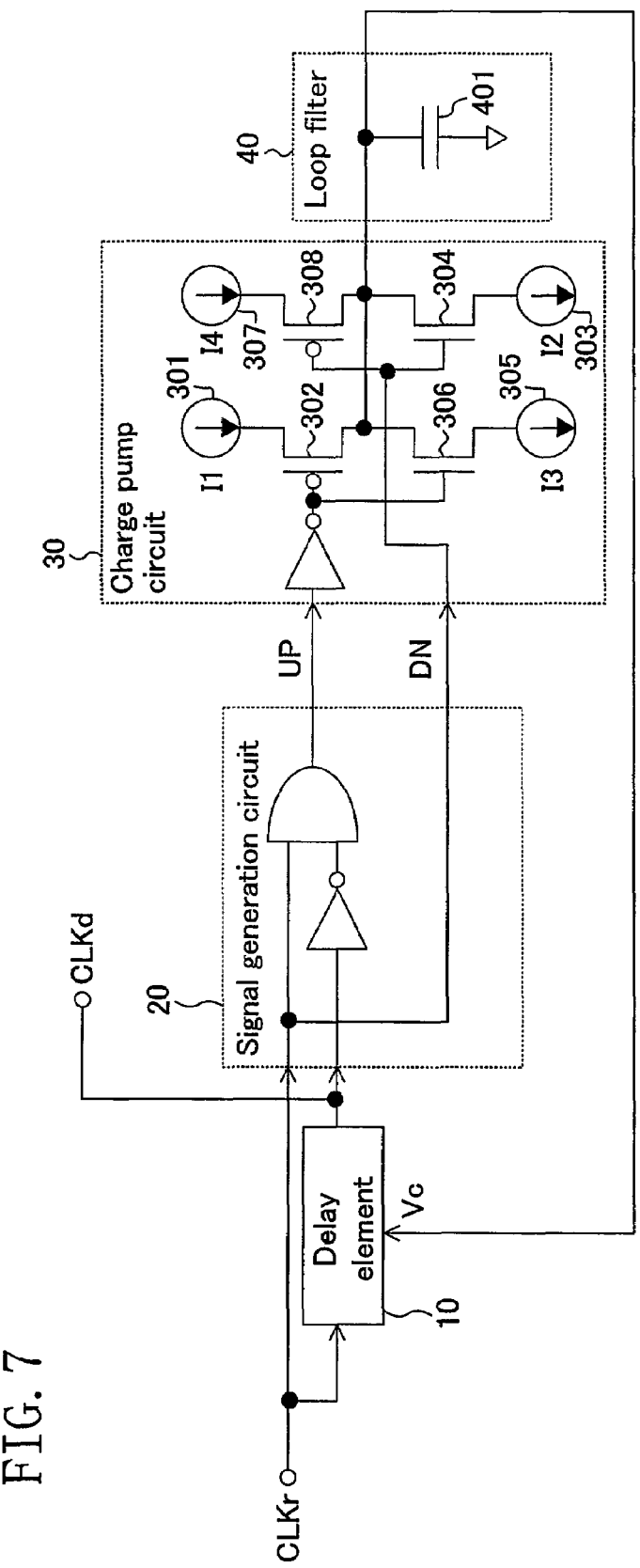
FIG. 7 shows a structure of a delay locked loop circuit according to embodiment 3.

FIG. 7 shows a structure of a delay locked loop circuit according to embodiment 3 of the present invention. The delay locked loop circuit of embodiment 3 includes a charge pump circuit 30 whose structure is different from that of the charge pump circuit 30 of embodiment 2. The charge pump circuit 30 of embodiment 3 includes a current source 305, a switch 306 for controlling conduction/interruption of electric current I3 supplied by the current source 305 according to signal UP, a current source 307, and a switch 308 for controlling conduction/interruption of electric current I4 supplied by the current source 307 according to signal DN in addition to the components of the charge pump circuit 30 of embodiment 2. Hereinafter, the delay locked loop circuit of embodiment 3 is described only as to the differences from the delay locked loop circuit of embodiment 2.

Figure 8:
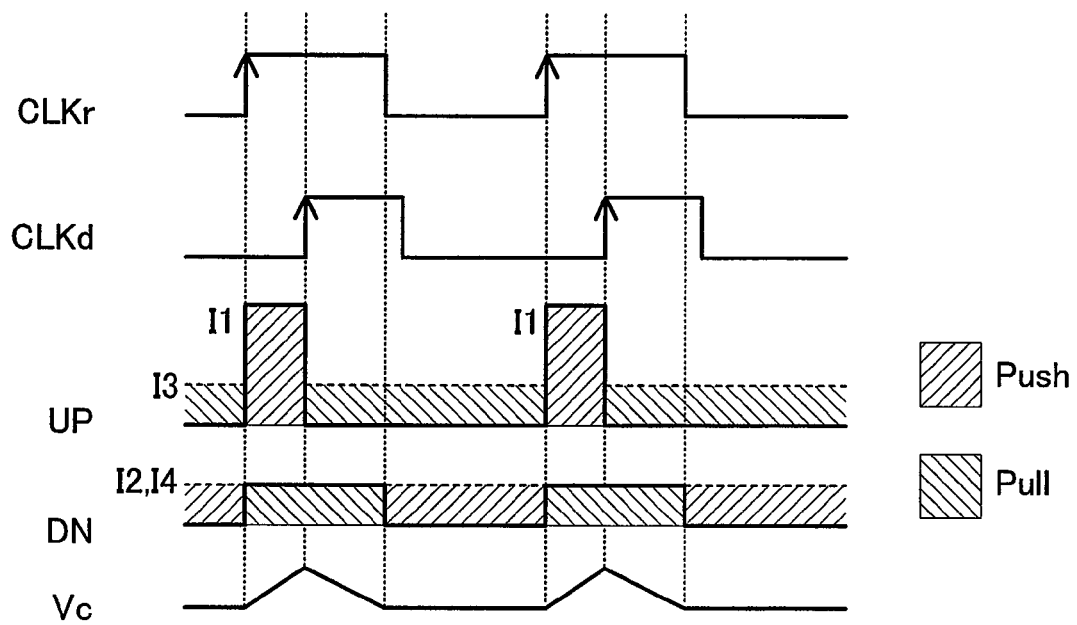
FIG. 8 is a timing chart of the delay locked loop circuit according to embodiment 3.

FIG. 8 is a timing chart of the delay locked loop circuit according to embodiment 3. In the timing chart shown in FIG. 8, the magnitude of an electric current flowing from the charge pump circuit 30 to the outside (push current) and the magnitude of an electric current flowing from the outside to the charge pump circuit 30 (pull current) are shown on the line segments of signal UP and signal DN by hatch lines.

When reference clock signal CLKr rises, signal UP and signal DN transition to Hi level, so that the switches 302 and 304 of the charge pump circuit 30 are closed. Accordingly, the difference between current I1 and current I2 is supplied from the charge pump circuit 30 to the loop filter 40, and control voltage Vc gradually increases. When a certain time period is passed after the rising of reference clock signal CLKr, delayed clock signal CLKd rises. As a result, only signal UP falls to Lo level so that only the switch 302 is opened while the switch 306 is closed instead. The sum of current I2 and current I3 is introduced from the loop filter 40 to the charge pump circuit 30, and accordingly, control voltage Vc gradually decreases to the original level. When reference clock signal CLKr falls, signal DN transitions to Lo level, so that the switch 304 is opened while the switch 308 is closed instead.

Accordingly, the difference between current I3 and current I4 is supplied to the loop filter 40. When currents I3 and I4 are equal, the push current and the pull current cancel each other. During a period when reference clock signal CLKr is at Lo level, the push-pull operation of the charge pump circuit 30 stops in appearance.

Even in the delay locked loop circuit of embodiment 3, by appropriately setting the magnitude of currents I1, I2, I3 and I4, delayed clock signal CLKd can be adjusted so as to rise at a time point which internally divides the on-duty period of reference clock signal CLKr in a desired ratio. Especially when currents I2, I3 and I4 are equal in magnitude and the magnitude of current I1 is three times the magnitude of current I2, I3 or I4, the magnitude of a current which is supplied to the loop filter 40 when the switches 302 and 304 of the charge pump circuit 30 are closed is equal to the magnitude of a current which is introduced from the loop filter 40 when the switches 304 and 306 of the charge pump circuit 30 are closed. As a result, the rising of delayed clock signal CLKd occurs just at the midpoint of the on-duty period of reference clock signal CLKr.

According to embodiment 3, the structure of the signal generation circuit 20 is simpler than that of the signal generation circuit 20 of embodiment 1. Thus, the circuit scale of the entire delay locked loop circuit is decreased.

Embodiment 4

Figure 9:
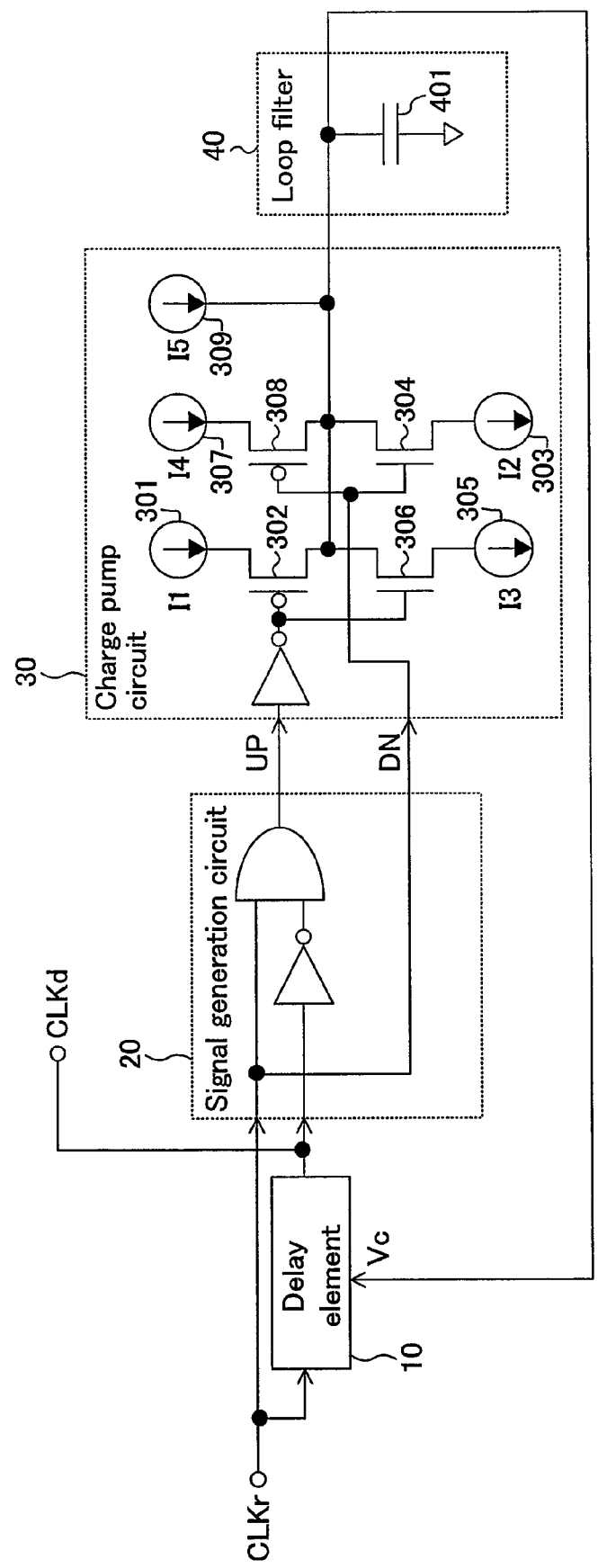
FIG. 9 shows a structure of a delay locked loop circuit according to embodiment 4.

FIG. 9 shows a structure of a delay locked loop circuit according to embodiment 4 of the present invention. The delay locked loop circuit of embodiment 4 includes a charge pump circuit 30 whose structure is different from those of the charge pump circuit 30 of embodiment 2 and the charge pump circuit 30 of embodiment 3. The charge pump circuit 30 of embodiment 4 includes a current source 309 for supplying electric current I5 whose polarity is the same as that of the current supplied by the current source 301 in addition to the components of the charge pump circuit 30 of embodiment 3. That is, in the charge pump circuit 30 of embodiment 4, current I5 is always supplied from the current source 309 irrespective of the state of signals UP and DN. Hereinafter, the delay locked loop circuit of embodiment 4 is described only as to the differences from the delay locked loop circuit of embodiment 3.

Figure 10:
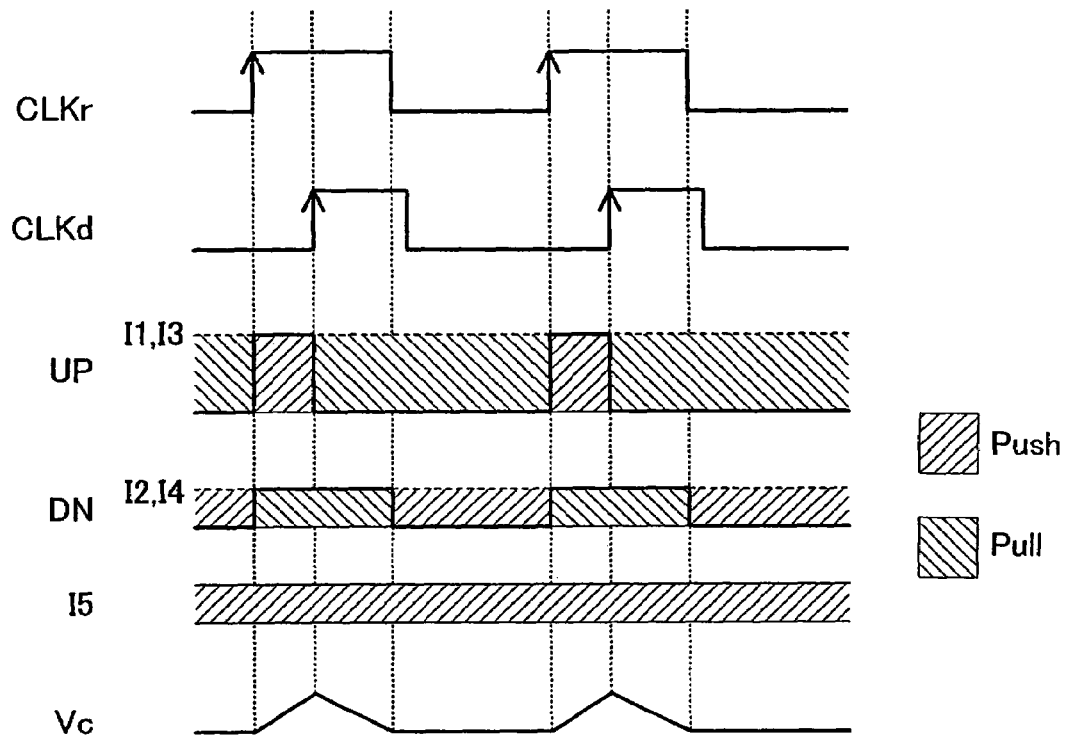
FIG. 10 is a timing chart of the delay locked loop circuit according to embodiment 4.

FIG. 10 is a timing chart of the delay locked loop circuit according to embodiment 4. In the timing chart shown in FIG. 10, the magnitude of an electric current flowing from the charge pump circuit 30 to the outside (push current) and the magnitude of an electric current flowing from the outside to the charge pump circuit 30 (pull current) are shown on the line segments of signal UP and signal DN by hatch lines.

When reference clock signal CLKr rises, signal UP and signal DN transition to Hi level, so that the switches 302 and 304 of the charge pump circuit 30 are closed. Accordingly, the difference between the sum of current I1 and current I5 and current I2 is supplied from the charge pump circuit 30 to the loop filter 40, and control voltage Vc gradually increases. When a certain time period is passed after the rising of reference clock signal CLKr, delayed clock signal CLKd rises. As a result, only signal UP falls to Lo level so that the switch 302 is opened while the switch 306 is closed instead. The difference between the sum of current I2 and current I3 and current I5 is introduced from the loop filter 40 to the charge pump circuit 30, and accordingly, control voltage Vc gradually decreases to the original level. When reference clock signal CLKr falls, signal DN transitions to Lo level, so that the switch 304 is opened while the switch 308 is closed instead.

Accordingly, the difference between the sum of current I4 and current I5 and current I3 is supplied to the loop filter 40. When the sum of currents I4 and I5 is equal to current I3, the push current and the pull current cancel each other. During a period when reference clock signal CLKr is at Lo level, the push-pull operation of the charge pump circuit 30 stops in appearance.

Even in the delay locked loop circuit of embodiment 4, by appropriately setting the magnitude of currents I1, I2, I3, I4 and I5, delayed clock signal CLKd can be adjusted so as to rise at a time point which internally divides the on-duty period of reference clock signal CLKr in a desired ratio. Especially when currents I1 and I3 are equal in magnitude, currents I2, I4 and I5 are equal in magnitude, and the magnitude of each of currents I1 and I3 is twice the magnitude of current I2, I4 or I5, the magnitude of a current which is supplied to the loop filter 40 when the switches 302 and 304 of the charge pump circuit 30 are closed is equal to the magnitude of a current which is introduced from the loop filter 40 when the switches 304 and 306 of the charge pump circuit 30 are closed. As a result, the rising of delayed clock signal CLKd occurs just at the midpoint of the on-duty period of reference clock signal CLKr.

According to embodiment 4, the structure of the signal generation circuit 20 is simpler than that of the signal generation circuit 20 of embodiment 1. Thus, the circuit scale of the entire delay locked loop circuit is decreased.

Figure 11:
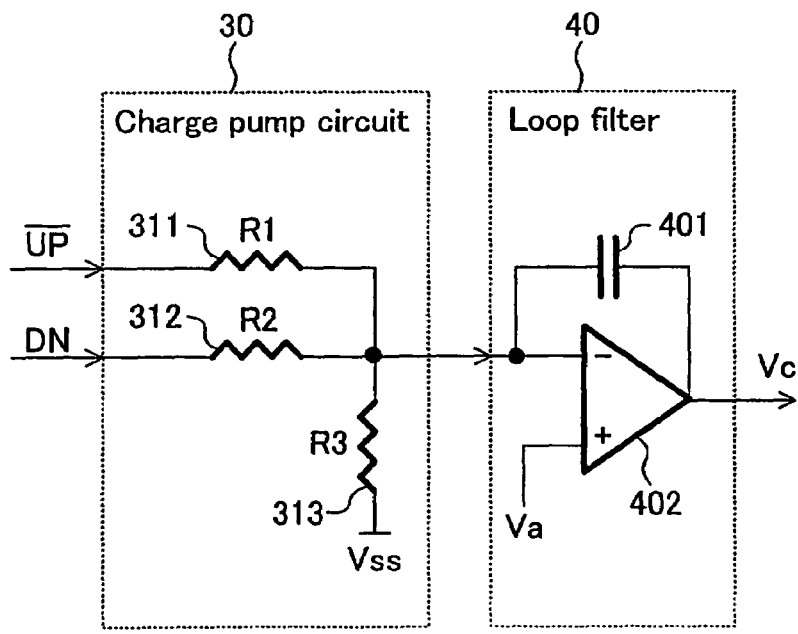
FIG. 11 is a variation of a charge pump circuit and loop filter shown in FIG. 9.

In the charge pump circuit 30 of embodiment 4, an electric current of a constant magnitude continuously flows while changing its direction according to signals UP and DN. Thus, switching control as to conduction/interruption of the current is not necessary any more, and the circuit structure as shown in FIG. 11 is possible. The charge pump circuit 30 includes a resistance 311 (resistance value R1) which receives the inverse of signal UP (hereinafter, "signal/UP"), a resistance 312 (resistance value R2) which receives signal DN, and a resistance 313 (resistance value R3). One end of the resistance 313 is connected to a connection point of the resistances 311 and 312, and the other end of the resistance 313 is supplied with ground voltage Vss. The loop filter 40 includes a capacitance 401 and an operational amplifier 402. The negative feedback portion of the operational amplifier 402 is connected to the capacitance 401. The inversion input terminal of the operational amplifier 402 is connected to a connection point of the resistances 311, 312 and 313 of the charge pump circuit 30. The non-inverted input terminal of the operational amplifier 402 is supplied with voltage Va.

In FIG. 11, where the Hi-level voltage and Lo-level voltage of signals/UP and DN are supply voltage Vdd and ground voltage Vss (=0), respectively, when reference clock signal CLKr rises, signals/UP and DN are ground voltage Vss and supply voltage Vdd, respectively. Where the resistance values of the resistances 311, 312, and 313 and voltage Va are set such that the following conditions are satisfied:

$$R2 = R3 = 2R1 = R, \text{ and}$$

$$Va = (Vdd - Vss)/2 = Vdd/2,$$

if signals/UP and DN are ground voltage Vss and supply voltage Vdd, respectively, a current which has a magnitude of Vdd/R flows from the resistance 311 to the input terminal of signal/UP, while a current which has a magnitude of Vdd/2/R flows from the input terminal of signal DN to the resistance 312. Further, a current which has a magnitude of Vdd/2/R flows from the connection point of the resistances 311, 312, and 313 to the ground node. Thus, according to the Kirchhoff s principle, current Vdd/R flows from the output side of the operational amplifier 402 to the connection point of the resistances 311, 312, and 313 via the capacitance 401. As a result, control voltage Vc gradually increases.

When a certain time period is passed after the rising of reference clock signal CLKr, delayed clock signal CLKd rises. As a result, signal/UP transitions to supply voltage Vdd so that a current which has a magnitude of Vdd/R flows from the input terminal of signal/UP to the resistance 311. Thus, according to the Kirchhoff's principle, current Vdd/R flows from the connection point of the resistances 311, 312, and 313 to the output side of the operational amplifier 402 via the capacitance 401. As a result, control voltage Vc gradually decreases to the original level.

Thereafter, when reference clock signal CLKr falls, signal DN transitions to ground voltage Vss (=0), so that a current which has a magnitude of Vdd/2/R flows from the resistance 312 to the input terminal of signal DN. Thus, the current which flows from the input terminal of signal/UP to the resistance 311 flows out through the resistances 312 and 313 and stops flowing into the loop filter 40. That is, during a period when reference clock signal CLKr is at Lo level, the push-pull operation of the charge pump circuit 30 stops in appearance.

As described above, the delay locked loop circuit including the charge pump circuit 30 and the loop filter 40 which are shown in FIG. 11 operates in the same way as does the delay locked loop circuit of embodiment 4 shown in FIG. 9. Since switches are not used in the variation shown in FIG. 11, deterioration in current accuracy which would occur due to switching noise does not occur. Further, the delay locked loop circuit of this variation operates with a lower voltage as compared with the delay locked loop circuit shown in FIG. 9.

Embodiment 5

Figure 12:
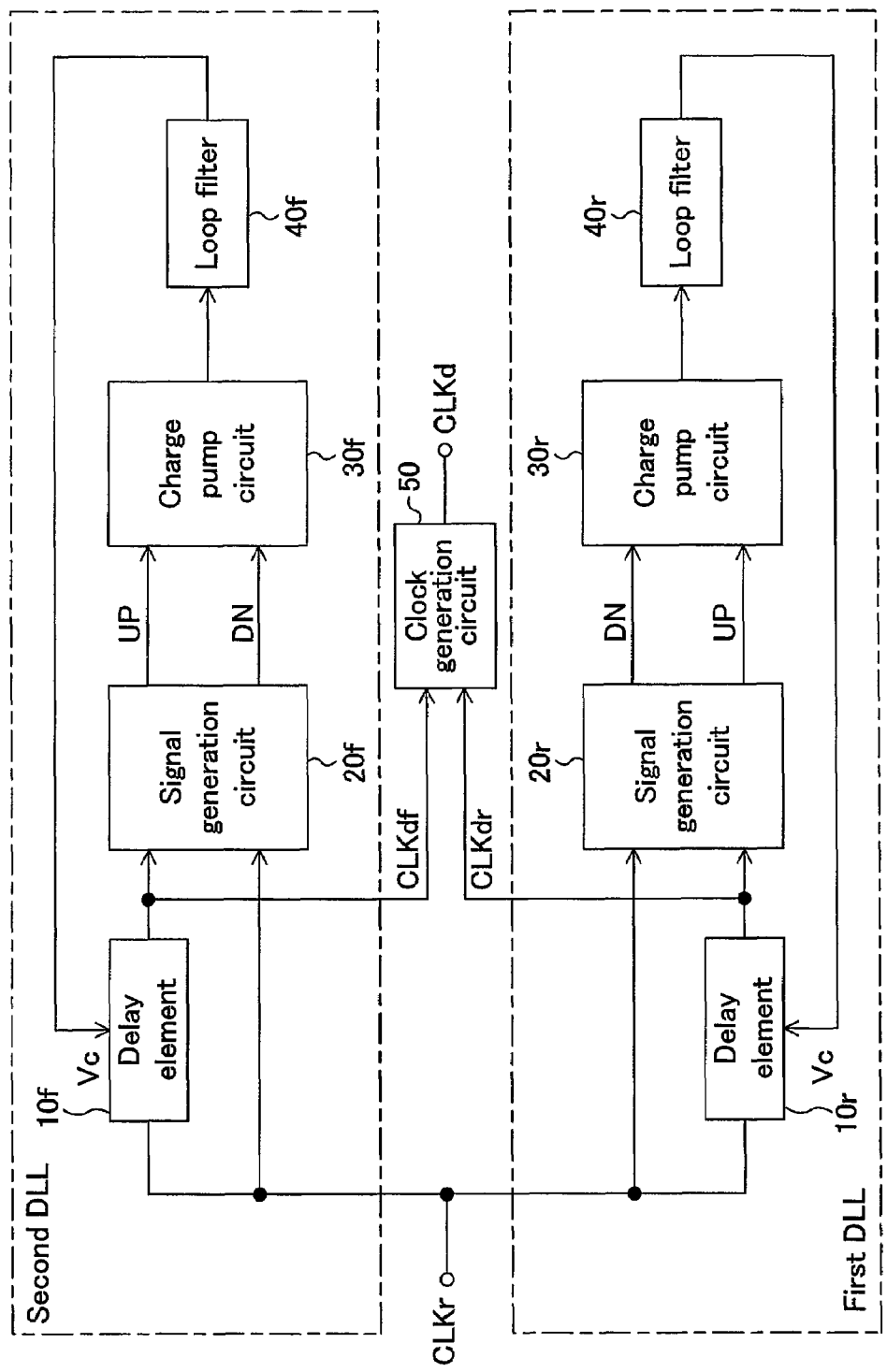
FIG. 12 shows a structure of a delay locked loop circuit according to embodiment 5.

FIG. 12 shows a structure of a delay locked loop circuit according to embodiment 5. The delay locked loop circuit of embodiment 5 includes a combination of any two of the delay locked loop circuits of embodiments 1 to 4. The first delay locked loop circuit includes a delay element $10r$, a signal generation circuit $20r$, a charge pump circuit $30r$ and a loop filter $40r$. The second delay locked loop circuit includes a delay element $10f$, a signal generation circuit $20f$, a charge pump circuit $30f$ and a loop filter $40f$. The first and second delay locked loop circuits output delayed clock signals CLKdr and CLKdf, respectively. The logic level of each of delayed clock signals CLKdr and CLKdf changes after some delay from rising and falling of reference clock signal CLKr. The specific structures of the first and second delay locked loop circuits are the same as those described in embodiments 1 to 4. The delay locked loop circuit of embodiment 5 further includes a clock generation circuit 50. Hereinafter, only the distinctive features of embodiment 5 will be described.

Figure 13:
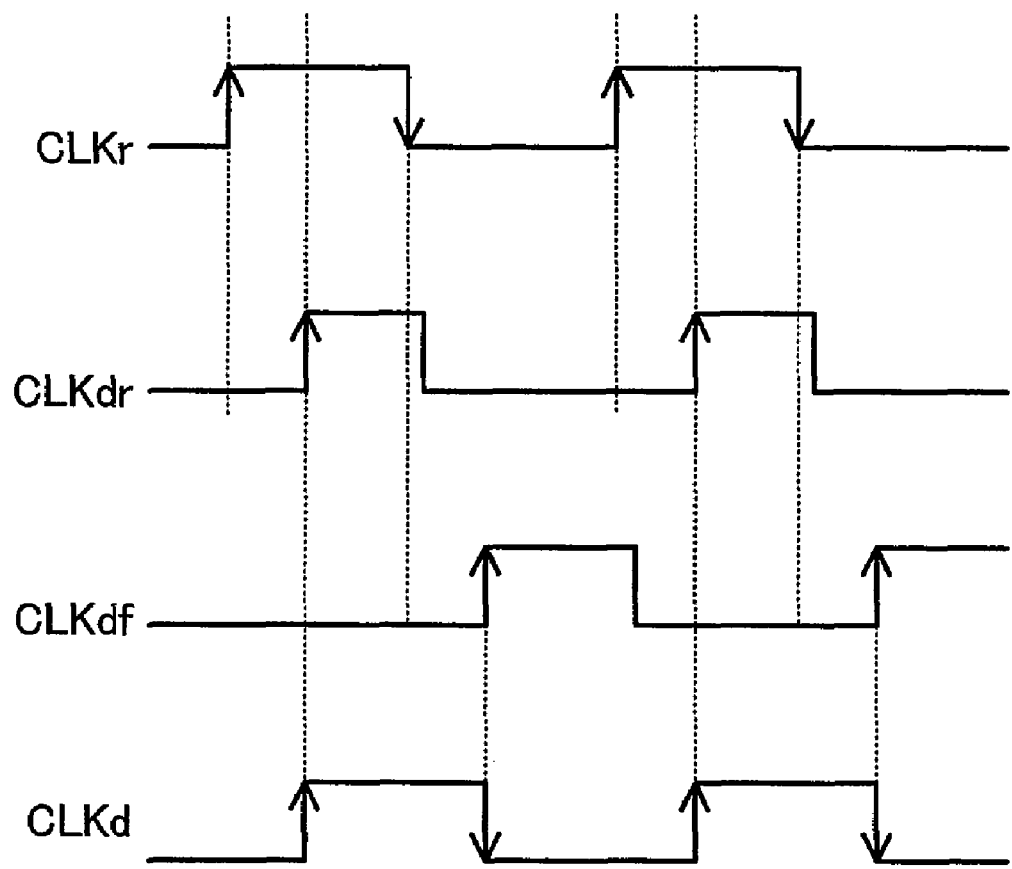
FIG. 13 is a timing chart of the delay locked loop circuit according to embodiment 5.

The clock generation circuit 50 generates delayed clock signal CLKd from delayed clock signals CLKdr and CLKdf. FIG. 13 is a timing chart of the delay locked loop circuit of embodiment 5. There are various methods for generating delayed clock signal CLKd. For example, as shown in FIG. 13, delayed clock signal CLKd rises at the rising of delayed clock signal CLKdr and falls at the rising of delayed clock signal CLKdf.

Especially when the first and second delay locked loop circuits are constructed such that delayed clock signals CLKdr and CLKdf rise at the midpoints of the on-duty period and off-duty period of reference clock signal CLKr, respectively, delayed clock signal CLKd rises just at the midpoint of the on-duty period of reference clock signal CLKr and falls just at the midpoint of the off-duty period of reference clock signal CLKr. In this case, the on-duty period of delayed clock signal CLKd is:

$$\alpha T/2 + (1-\alpha)T/2 = T/2$$

where T is a cycle of reference clock signal CLKr, and $\alpha$ is the duty ratio of reference clock signal CLKr. That is, the on-duty period of delayed clock signal CLKd is just a half of a cycle of reference clock signal CLKr (T/2). Namely, the duty ratio of delayed clock signal CLKd is 50% irrespective of the duty ratio of reference clock signal CLKr.

As described above, according to embodiment 5, the logic level of delayed clock signal CLKd changes with a delay of ¼ phase (90°) and a delay of ¾ phase (270°) from reference clock signal CLKr. Further, the duty ratio of reference clock signal CLKr is corrected.

Figure 14:
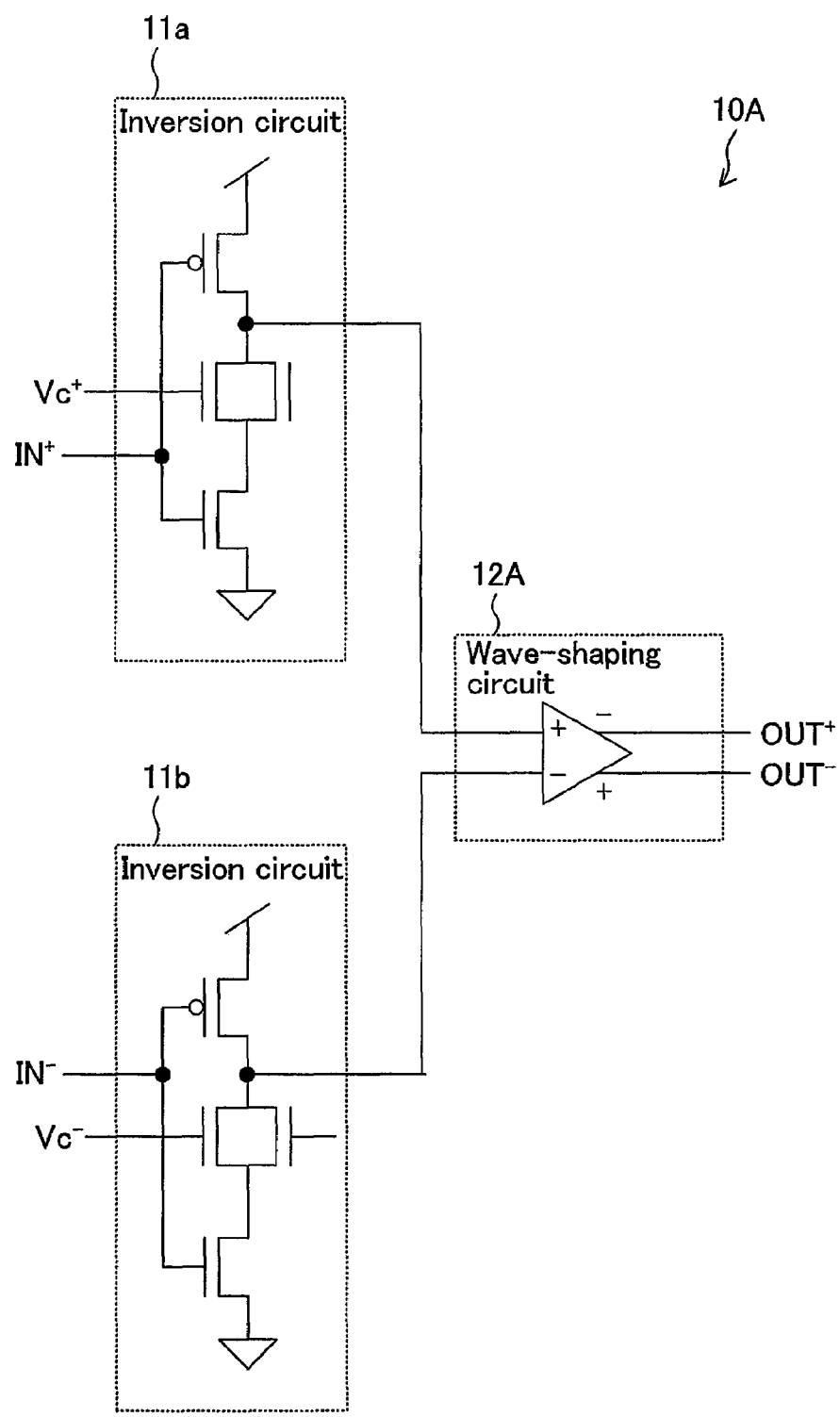
FIG. 14 shows a structure of a delay element constructed as a differential circuit.

In embodiment 5, when the delay element $10r$ and the delay element $10f$ are formed by differential circuits, the delay element $10r$ and the delay element $10f$ are more robust against noise. Specifically, the delay element $10r$ and the delay element $10f$ each can be formed by the differential circuit shown in FIG. 14. A delay element 10A shown in FIG. 14 includes inversion circuits $11a$ and $11b$, each of which is the same as the inversion circuit 11 shown in FIG. 2, and a wave-shaping circuit 12A which has a differential amplifier. The inversion circuits $11a$ and $11b$ receive signals IN$^+$ and IN$^-$, respectively, as differential input signals. The wave-shaping circuit 12A shapes the waveform of signals output from the inversion circuits $11a$ and $11b$ to output signals OUT$^+$ and OUT$^-$. When the differential circuit of FIG. 14 is applied to the delay locked loop circuit of FIG. 12, reference clock signal CLKr is input as signal IN$^+$ and the inverse of reference clock signal CLKr is input as signal IN$^-$, and signals OUT$^+$ and OUT$^-$ correspond to delayed clock signals CLKdr and CLKdf, respectively. When the delay element is thus formed by the differential circuit, inphase noise generated in the power supply, or the like, is canceled. As a result, a delayed clock signal can be generated with higher accuracy.

Embodiment 6

Figure 15:
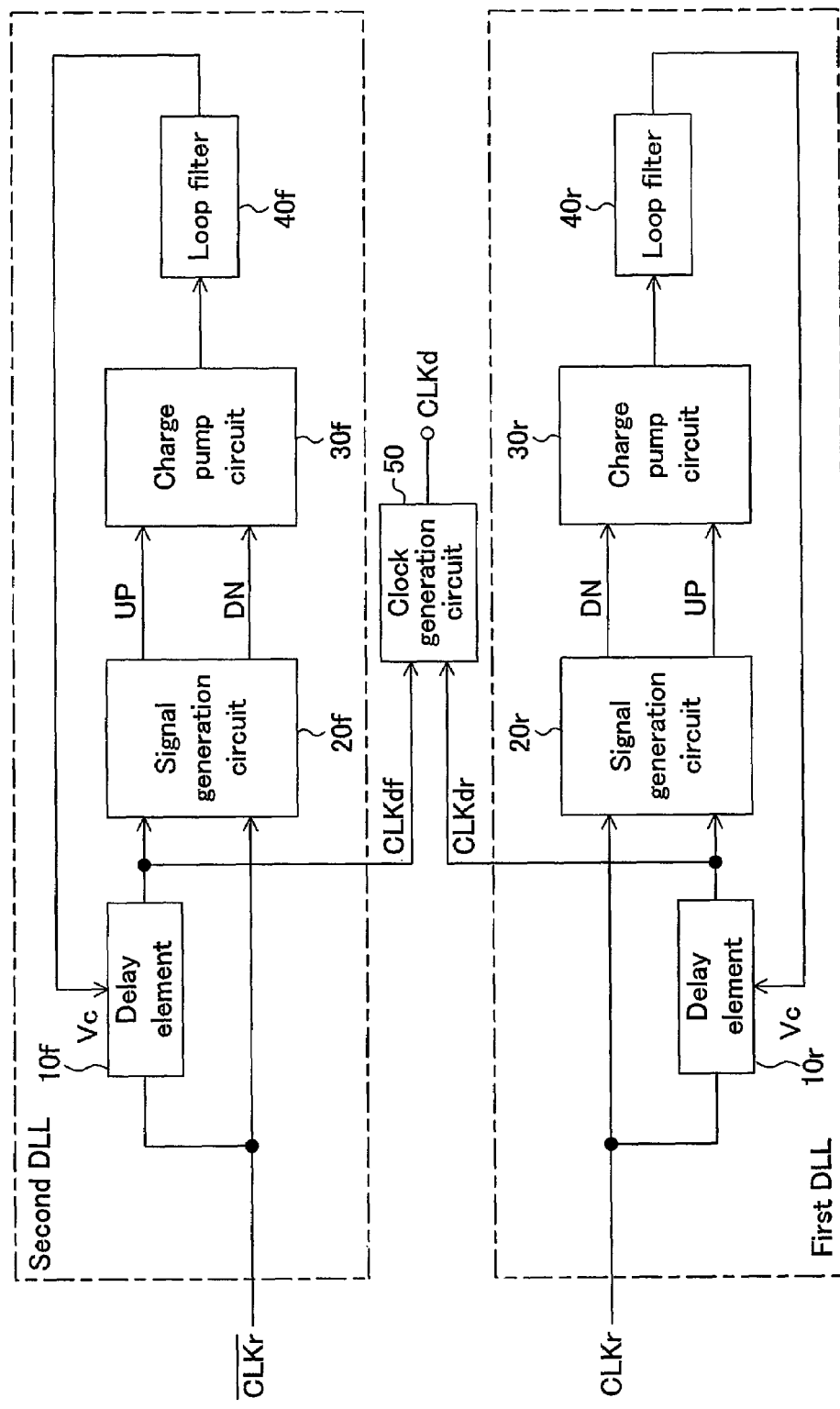
FIG. 15 shows a structure of a delay locked loop circuit according to embodiment 6.
Figure 16:
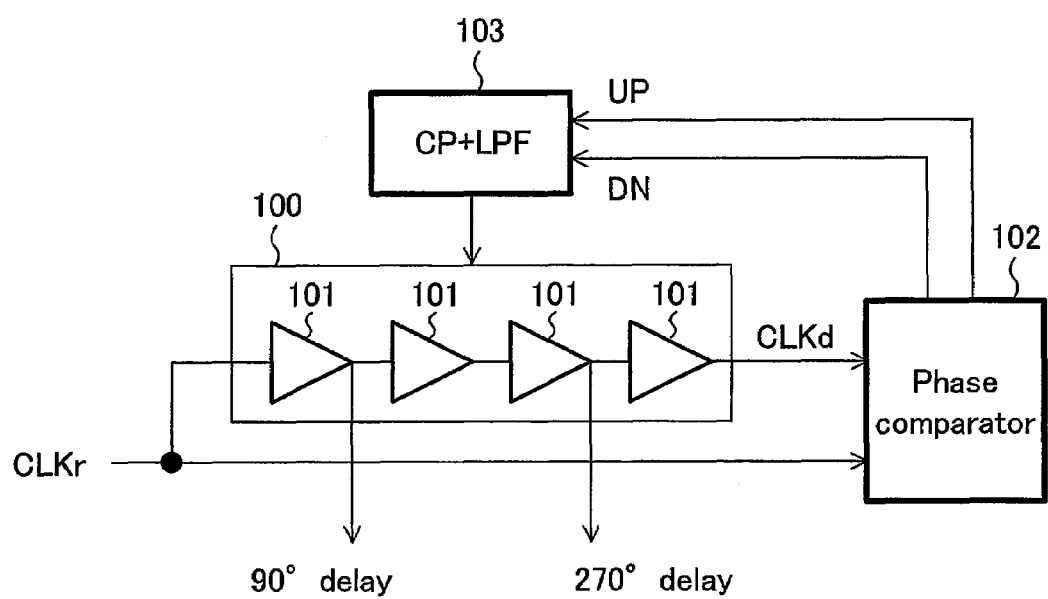
FIG. 16 shows a structure of a conventional delay locked loop circuit.

FIG. 15 shows a structure of a delay locked loop circuit according to embodiment 6. The delay locked loop circuit of embodiment 6 is substantially the same as that of the delay locked loop circuit of embodiment 5 except that reference clock signal CLKr and the inverse thereof (hereinafter, referred to as "reference clock signal/CLKr"), which are in an antiphase relationship, are supplied to the first and second delay locked loop circuits of the delay locked loop circuit of embodiment 5.

The first and second delay locked loop circuits output delayed clock signals CLKdr and CLKdf, respectively. The logic levels of delayed clock signals CLKdr and CLKdf change after some delay from the rising (or falling) of reference clock signals CLKr and/CLKr, respectively. That is, the second delay locked loop circuit outputs delayed clock signal CLKdf whose logic level substantially changes with some delay from the rising (or falling) of reference clock signal CLKr. Delayed clock signal CLKd generated by the clock generation circuit 50 is the same as that of embodiment 5.

In embodiment 6, the first and second delay locked loop circuits can have the same polarity and therefore can be realized by delay locked loop circuits of the same type. Thus, the circuit design can more readily be achieved.

In embodiments 5 and 6, new delayed clock signal CLKd is generated from delayed clock signals CLKdr and CLKdf which are generated by the delay elements 10r and 10f, respectively, but the present invention is not limited thereto. Delayed clock signal CLKd may be generated from signals other than delayed clock signals CLKdr and CLKdf. For example, delayed clock signal CLKd may be generated from signals which are generated based on delayed clock signals CLKdr and CLKdf and whose logic levels change with the delay of a predetermined phase from the rising (or falling) of reference clock signals CLKr and/CLKr, for example, signal UP and signal DN which are generated by the signal generation circuits 20r and 20f, respectively.

The output clock signal of the delay locked loop circuits of embodiments 1 to 4 is not limited to delayed clock signal CLKd generated by the delay element 10. For example, the output clock signal may be signal UP generated by the signal generation circuit 20 or, in the case of embodiment 1, may be signal DN generated by the signal generation circuit 20. Since signal UP is a result of the waveform shaping of delayed clock signal CLKd, it is rather preferable that signal UP is output from the delay locked loop circuit.

As illustrated in the timing chart of FIG. 4, control voltage Vc increases (or decreases) during an on-duty (or off-duty) period of reference clock signal CLKr and then returns to the original level. This change of control voltage Vc can be realized based on signals UP and DN which complementarily change according to the rising and falling of reference clock signal CLKr and the rising of delayed clock signal CLKd (or the falling of delayed clock signal CLKd if delayed clock signal CLKd falls with some delay from any one of the rising and falling of reference clock signal CLKr). Therefore, various circuit structures which are different from the signal generation circuits 20 and charge pump circuits 30 described in the above embodiments can be realized. For example, the structures of the signal generation circuit 20 and charge pump circuit 30 may be modified such that, in the timing chart of FIG. 6, signal UP transitions to logic level Hi during an interval extending from the rising of delayed clock signal CLKd to the falling of reference clock signal CLKr. In this case, the effects achieved by the present invention remain the same.

What is claimed is:

1. A timing generation circuit, comprising:
a first loop circuit and a second loop circuit, each of which is supplied with a common reference clock signal and each of which outputs a clock signal delayed from the common reference clock signal; and
a clock generation circuit for generating a delayed clock signal from the clock signals output from the first loop circuit and the second loop circuit, the delayed clock signal including any one of a rising edge and a falling edge with a delay from a rising edge of the common reference clock signal and including the other of the rising edge and the falling edge with a delay from a falling edge of the common reference clock signal, wherein:
the first loop circuit outputs the clock signal whose logic level transitions with a delay from a rising edge of the common reference clock signal, the delay being equal to a half of an on-duty period of the common reference clock signal; and
the second loop circuit outputs the clock signal whose logic level transitions with a delay from a falling edge of the common reference clock signal, the delay being equal to a half of an off-duty period of the common reference clock signal.

2. A timing generation circuit, comprising:
a first loop circuit and a second loop circuit, each of which is supplied with a common reference clock signal and each of which outputs a clock signal delayed from the common reference clock signal; and
a clock generation circuit for generating a delayed clock signal from the clock signals output from the first loop circuit and the second loop circuit, the delayed clock signal including any one of a rising edge and a falling edge with a delay from a rising edge of the common reference clock signal and including the other of the rising edge and the falling edge with a delay from a falling edge of the common reference clock signal, wherein each of the first loop circuit and second loop circuits includes:
a first circuit including a first transistor and a second transistor connected in series, the first transistor and the second transistor having opposite polarities and receiving the reference clock signal at gates of the first transistor and the second transistor, a third transistor connected between the first transistor and the second transistors which receives an output of a loop filter of the corresponding loop circuit at a gate of the third transistor; a voltage of a predetermined node between the first transistor and the second transistor being output from the first circuit as an output signal; and a second circuit for shaping a waveform of the output signal of the first circuit.

3. The timing generation circuit of claim 2, wherein the first circuit includes a current source connected in parallel with the third transistor.

4. The timing generation circuit of claim 2, wherein the second circuit includes:
an inverter which receives the output signal of the first circuit; and
a transistor which receives an input and output of the inverter at a drain and gate, respectively, a predetermined voltage being applied to the source of the transistor.

5. A timing generation circuit, comprising:
a first loop circuit for receiving a first reference clock signal and outputting a clock signal delayed from the first reference clock signal;
a second loop circuit for receiving a second reference clock signal which is in a phase opposite to that of the first reference clock signal and outputting a clock signal delayed from the second reference clock signal; and
a clock generation circuit for generating a delayed clock signal from the clock signals output from the first loop circuit and the second loop circuit, the delayed clock signal including any one of a rising edge and a falling edge with a delay from a rising edge of the first reference clock signal and including the other of the rising edge and the falling edge with a delay from a falling edge of the first reference clock signal, wherein:
the first loop circuit outputs the clock signal whose logic level transitions with a delay from a rising edge of the first reference clock signal, the delay being equal to a half of an on-duty period of the first reference clock signal; and
the second loop circuit outputs the clock signal whose logic level transitions with a delay from a rising edge of the second reference clock signal, the delay being equal to a half of an on-duty period of the second reference clock signal.

6. A timing generation circuit, comprising:
a first loop circuit for receiving a first reference clock signal and outputting a clock signal delayed from the first reference clock signal;
a second loop circuit for receiving a second reference clock signal which is in a phase opposite to that of the first reference clock signal and outputting a clock signal delayed from the second reference clock signal; and
a clock generation circuit for generating a delayed clock signal from the clock signals output from the first loop circuit and the second loop circuit, the delayed clock signal including any one of a rising edge and a falling edge with a delay from a rising edge of the first reference clock signal and including the other of the rising edge and the falling edge with a delay from a falling edge of the first reference clock signal,
wherein each of the first loop circuit and the second loop circuits includes:
a first circuit including a first transistor and a second transistor connected in series, the first transistor and the second transistor having opposite polarities and receiving the corresponding reference clock signal at gates of the first transistor and the second transistor, a third transistor connected between the first transistor and the second transistors which receives an output of a loop filter of the corresponding loop circuit at a gate of the third transistor; a voltage of a predetermined node between the first transistor and the second transistor being output from the first circuit as an output signal; and
a second circuit for shaping a waveform of the output signal of the first circuit.

7. The timing generation circuit of claim 6, wherein the first circuit includes a current source connected in parallel with the third transistor.

8. The timing generation circuit of claim 6, wherein the second circuit includes:
an inverter which receives the output signal of the first circuit; and
a transistor which receives an input and output of the inverter at a drain and gate, respectively, a predetermined voltage being applied to the source of the transistor.

* * * * *